(12) United States Patent
Takigami

(10) Patent No.: US 6,218,630 B1
(45) Date of Patent: *Apr. 17, 2001

(54) PRINTED CIRCUIT BOARD HAVING ARRAYS OF LANDS ARRANGED INSIDE AND OUTSIDE OF EACH OTHER HAVING A REDUCED TERMINAL-PITCH

(75) Inventor: Kotaro Takigami, Asaka (JP)

(73) Assignee: Fuji Photo Film Co., Ltd., Kanagawa (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/107,478

(22) Filed: Jun. 30, 1998

(30) Foreign Application Priority Data

Jun. 30, 1997 (JP) ..................................... 9-173489

(51) Int. Cl.[7] ............................. H01R 12/04; H05K 1/11
(52) U.S. Cl. ............................................. 174/261
(58) Field of Search .................... 174/261, 262, 174/68.5, 260; 29/195, 829; 361/382, 104, 767, 768, 770, 771, 772, 773, 774, 775, 776, 777, 778, 779, 783, 807, 720; 257/668

(56) References Cited

U.S. PATENT DOCUMENTS

| | | | |
|---|---|---|---|
| 4,600,970 | * | 7/1986 | Bauer .................................... 361/768 |
| 5,285,352 | * | 2/1994 | Pastpre et al. ........................ 361/707 |
| 5,547,740 | * | 8/1996 | Higdon et al. ........................ 428/209 |
| 5,585,162 | * | 12/1996 | Schueller .............................. 428/131 |
| 5,641,946 | * | 6/1997 | Shim ..................................... 174/261 |
| 5,869,887 | * | 2/1999 | Urushima ............................. 257/684 |
| 5,885,476 | * | 3/1999 | Hong et al. .......................... 252/79.2 |
| 5,906,042 | * | 5/1999 | Lan et al. .............................. 29/852 |
| 5,977,641 | * | 11/1999 | Takahashi et al. ................... 257/778 |
| 5,982,033 | * | 11/1999 | Ohsawa et al. ...................... 257/737 |
| 5,982,186 | * | 11/1999 | Buschbom ........................... 324/755 |

* cited by examiner

Primary Examiner—Jeffrey Gaffin
Assistant Examiner—Jeremy Norris

(57) ABSTRACT

A printed circuit board includes a plurality of lands thereon. The size D2 of the outer land 3 in the direction along the outside array is less than the size D1 of the inner land 1 in the direction along the inside array. Therefore, it is possible to pass the pattern 4 with enough clearance against the outer land 3. The outer lands 3 are formed with an oval, elliptical or oblong shape. Namely, the size D3 of the outer land 3 in the direction perpendicular to the direction of the outside array is greater than the size D2. Then, it is possible to ensure a sufficient reliability of a soldered part. Preferably, the connected area 5 between the inner land 1 and the pattern 4 and the connected area 7 between the outer land 3 and the pattern 6 are formed as a shape of a tear-drop. Then, the patterns 4, 6 cannot be easily cut by a thermal stock or a heat cycle. The solder resist 8 is coated, around the outer land 3, from an outer area to an inner area of the outer land 3, except for the central area 3A. The resist 8 is further coated, around the inner land 1, from an outer area to an inner area of the inner land 1, except for the central area 1A. Then, each area 5, 7 is reinforced by the resist 8. Further, since a clearance between exposed areas 1A and a clearance between exposed areas 3A are widened, a bridge of solder does not easily occur.

17 Claims, 6 Drawing Sheets

PRINTED CIRCUIT BOARD HAVING ARRAYS OF LANDS ARRANGED INSIDE AND OUTSIDE OF EACH OTHER HAVING A REDUCED TERMINAL-PITCH

FIELD OF THE INVENTION

This invention relates to a printed circuit board suitable for mounting parts, which has many ball-type terminals arranged in a plurality rows with a narrow pitch.

BACKGROUND DESCRIPTION

As a shape of terminal formed on an IC (Integrated Circuit), a pin-type or lead-type terminal and a ball-type or bump-type terminal are known. An IC having pin-type terminals arranged in a row is known as a PGA (Pin Grid Array). An IC having ball-type terminals arranged in a row is known as a BGA (Ball Grid Array).

The BGA is more suitable for a high-density mounting than the PGA for the following reasons.
(1) It is possible to narrow a pitch between the terminals. As a result, it is possible to make a small-sized IC which has many ball-type terminals.
(2) It is not necessary to make a hole in a land of a printed circuit board, wherein ball-type terminals are not passed through the hole. As a result, it is possible to make a small-sized land. Further, it is possible to narrow a pitch between the lands.

FIG. 8 shows a side view of a printed circuit board 70 on which the BGA 60 is mounted. The BGA 60 has an array of the ball-type terminals 61. Then, corresponding to the arrays of the ball-type terminals 61, an array of the lands 71 is formed on the printed circuit board 70. Each ball-type terminal 61 is connected with each land 71 by the solder 80.

The BGA, of which terminals are arrayed in a row with a narrower pitch than 0.8mm, is known as a CSP (Chip Size Package) because a package-size of the BGA is close to a size of a chip inside the BGA package.

However, in a case that a pitch between terminals is about 0.5mm and the CSP has two arrays respectively arranged in an inner row and in an outer row, it is technically impossible to mount the CSP on a printed circuit board for the following reasons (1)~(4).
(1) The printed circuit board 70 shown in FIG. 9 is considered in this discussion. On the printed circuit board 70, with a pitch of 0.5 mm, an array of inner lands 72 of a circular shape and an array of outer lands 73, also of a circular shape, are formed. Further, on the printed circuit board 70, a pattern 74 from the inner land 72 is passed through a gap between the outer lands 73.
(2) In the prior art, a diameter of the outer land 73 is 0.4 mm and a diameter of the inner land 72 is also 0.4 mm.
(3) If the width of the pattern 74 is 150 μm, which is generally used, it is impossible for the pattern 74 to pass through the gap between the outer terminals 73 because the gap is 0.1 mm (=0.5−0.4=100 μm).
(4) Further, if the width of the pattern 74 is 50 μm, which is the minimum for practical use, it is also impossible for the pattern 74 to pass through the gap between the outer terminals 73 because a gap between the the pattern 74 and the adjacent outer terminal 73 is typically 25 μm (=(100−50)/2).

On the other hand, it is considered to draw the pattern 74 from the inner land 72 via a thru-hole which is formed in a area 75 surrounded by the array of the inner lands 72. However, in the case of CSP, extremely small thru-holes are necessary for this purpose because the area 75 is very small and many patterns 74 are formed. Since such a small thru-hole cannot be formed by usual multi-layer techniques, the printed circuit board becomes very expensive. Thus, it is not practical to use such a thru-hole.

SUMMARY OF THE INVENTION

An object of the present invention is to provide a printed circuit board suitable for mounting parts, which has a plurality of arrays of ball-type terminals with a narrow pitch.

In a preferred embodiment, the present invention is directed to a printed circuit board for mounting parts, which has a plurality of arrays of ball-type terminals arranged inside and outside of one another, said printed circuit board comprising:
 a plurality of arrays of lands arranged relatively inside and outside of one another, formed corresponding to said arrays of ball-type terminals; and
 a pattern, originating from an inner land and continuing between two outer lands, wherein
 a size of an outer land, in a direction along an outside array is smaller than a size of an inner land in a direction along an inside array.

In a further preferred embodiment, a size of the outer land in a direction perpendicular to the direction of the outside array is larger than the size of the outer land in the direction along the outside array.

In a still further preferred embodiment, the size of the outer land along the direction of the outside array is equal to or smaller than 0.15 mm, a pitch of the inner lands is equal to or smaller than 0.5 mm and a pitch of the outer lands is equal to or smaller than 0.5 mm.

In another preferred embodiment, a pattern is connected with an outer land and a width of the pattern is gradually widened in a connected area between the outer land and the pattern.

In yet a further preferred embodiment, a pattern is connected with an inner land and a width of the pattern is gradually widened in a connected area between the inner land and the pattern.

In an even further preferred embodiment, a resist or a solder resist is coated, around the outer land, from an outer area to an inner area of the outer land.

In yet an even further preferred embodiment, the resist is coated, around the inner land, from an outer area to an inner area of the inner land.

These and other objects of the present application will become more readily apparent from the detailed description given hereafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description and the accompanying drawings which are given by way of illustration only and wherein.

DESCRIPTION OF THE PREFERRED EMBODIMENTS

Referring to FIGS. 1~7, embodiments of the present invention will be explained.

Figure 1:
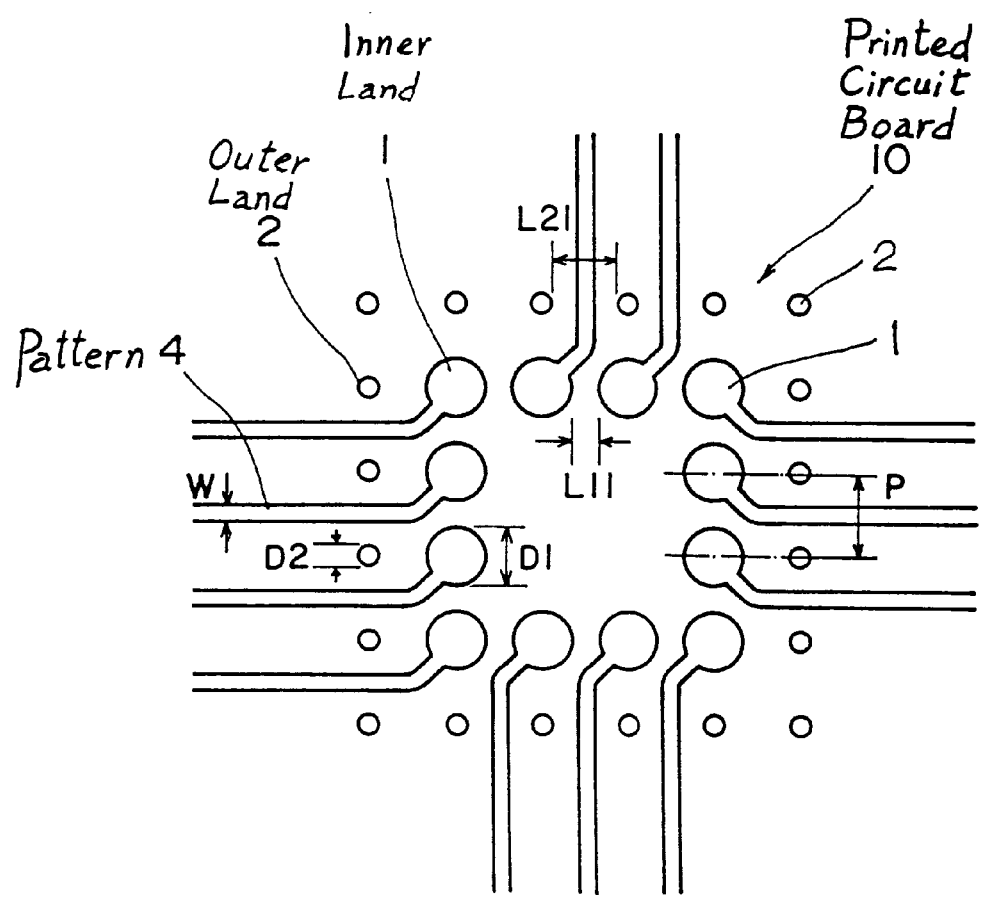
FIG. 1 shows a plan view of a basic configuration of a printed circuit board as an embodiment of the present invention.

A basic configuration of a printed circuit board is shown in FIG. 1. The printed circuit board 10 shown in FIG. 1 is intended to be used for mounting a CSP. In this embodiment, it is assumed that the CSP has two arrays of ball-type terminals arranged inside and outside with a narrow terminal-pitch of 0.5 mm. On the printed circuit board 10, an array of inner lands 1 and an array of outer lands 2 are formed with a narrow land-pitch of 0.5 mm respectively and a pattern 4 is formed. Each pattern 4 is drawn from the inner land 1 and passed through a gap between the outer lands 3. Namely, the pattern 4 originates from the inner land 1 and continues between two outer lands 2. A size D2 of the outer land 2 in a direction along the outside array of the outer lands 2 is less than a size D1 of the inner land 1 in a direction along the inside array of the inner lands 1. Further, a clearance L21 between outer lands 2 is larger than a clearance L11 between inner lands 1. Therefore, it is possible to pass the pattern 4 with enough clearance against the outer land 2.

As a result, although a pitch between the outer lands 2 is equal to or smaller than 0.5 mm, it is possible to draw the pattern 4 from the inner land 1 and to pass the pattern 4 through a gap between the outer lands 2 on the printed circuit board 10. Therefore, the printed circuit board 10, which is suitable for mounting a CSP or the like having a plurality of arrays of the ball-type terminals arranged inside and outside with a very narrow terminal-pitch equal to less than about 0.5 mm, can be obtained.

For example, as a size and a shape of the lands on the printed circuit board 10 shown in FIG. 1, the inner land 1 is a round land with a diameter of 0.4 mm, the outer land 2 is also a round land with a diameter of 0.4 mm and a width W of the pattern 4 is 0.15 mm. In this case, the size D2 of the outer land 2 in the direction of the outside array of the outer lands 2 is 0.15 mm and the size D1 of the inner land 1 in the direction of the inside array of the inner lands 1 is 0.4 mm. The clearance between the pattern 4 and the outer land 2 is 0.1 mm.

Figure 2:
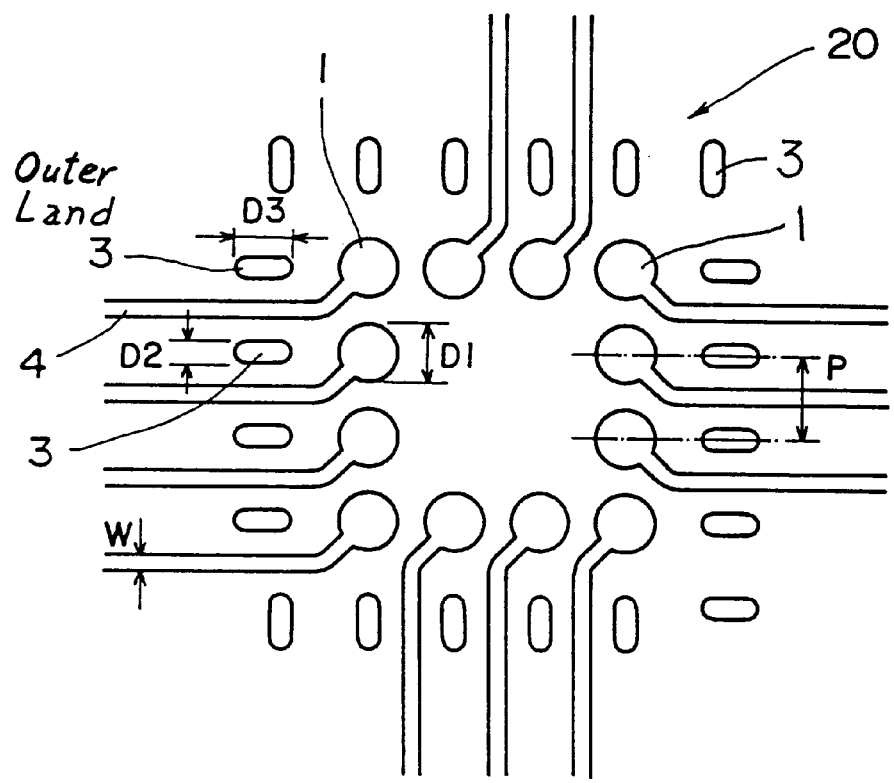
FIG. 2 shows a plan view of a configuration of a printed circuit board as another embodiment of the present invention.

Another configuration of a printed circuit board is shown in FIG. 2. Except for a change in the shape of the outer land from round to an oval, an elliptical or an oblong land, the printed circuit board 20 shown in FIG. 2 is the same as the printed circuit board 10 shown in FIG. 1. Namely, in the printed circuit board 20, the outer lands 3 are formed of an oval, an elliptical or an oblong shape. Further, in the printed circuit board 20, a size D3 of the outer land 3 in a direction perpendicular to the direction of the outside array of the outer lands 3 is larger than the size D2 of the outer land 3 in the direction along the outside array of the outer lands 3. As a result, although the size D2 of the outer land 3 along the direction of the outside array is smaller in size, because the size D3 is large, it is possible to ensure a sufficient reliability of a soldered part where the outer land 3 is connected with the ball-terminal of the CSP.

Namely, in the case that the diameter of the round or circular outer land 2 shown in FIG. 1 is equal to or less than 0.15 mm, an amount of solder is insufficient. Therefore, when a heat cycle is applied to the printed circuit board, the soldered part is easily damaged based on a difference of the coefficient of thermal expansion between the printed circuit board and the IC.

To avoid the damage, from a point of view that, in a direction perpendicular to the direction of the outside array of the outer lands 3, the size of the outer land is almost not limited, and the size D3 of the outer land 3 is enlarged as shown in FIG. 2. As a result, since the amount of solder can be increased, the reliability of the soldered part can be improved.

Namely, if D3 >D2, although the pitch between the lands is equal to or less than 0.5 mm, it is possible to reduce the size D2 below 0.15 mm. Therefore, the printed circuit board, which is suitable for mounting a CSP or the like having a plurality of arrays of the ball-type terminals with a very narrow terminal-pitch equal to or less than about 0.5 mm, can be obtained.

For example, in the case of D3 >D2, as a size and a shape of the lands on the printed circuit board 20 shown in FIG. 2, the land-pitch P is 0.5 mm, the inner land 1 is a round land with a diameter of 0.4 mm, the outer land 3 is an oval land with a width of 0.15 mm and a length of 0.4~1.0 mm. Further, a width W of the pattern 4 is 0.15 mm. In this case, the size D2 of the outer land 3 in the direction along the outside array of the outer lands 3 is 0.15 mm, the size D3 of the outer land 3 in the direction perpendicular to the direction of the outside array of the outer lands 3 is 0.4~1.0 mm, and the size D1 of the inner land 1 in the direction along the inside array of the inner lands 1 is 0.4 mm. The clearance between the pattern 4 and the outer land 3 is 0.1 mm.

Figure 3:
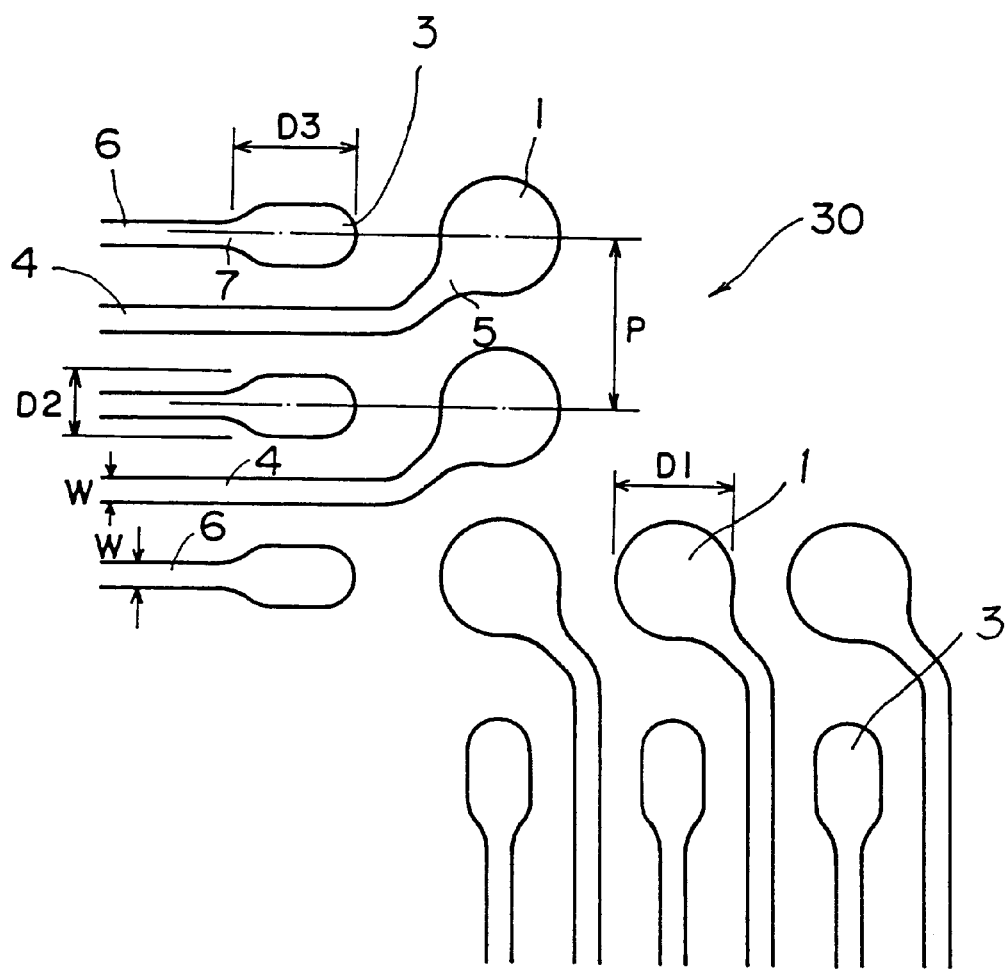
FIG. 3 shows a plan view of another configuration of a printed circuit board as yet another embodiment of the present invention.

Another configuration of a printed circuit board is shown in FIG. 3. Except for a change in a connection area between the pattern and the land, and except for a narrow width of the pattern, the printed circuit board 30 shown in FIG. 3 is the same as the printed circuit board 20 shown in FIG. 2.

Namely, the pattern 4 is connected with the inner land 1 and a width of the pattern 4 is gradually widened for the inner land 1 in the connected area 5 between the inner land 1 and the pattern 4 drawn from the inner land 1. A pattern 6 is also connected with the outer land 3 and a width of the pattern 6 is also gradually widened for the outer land 3 in a connected area 7 between the outer land 3 and the pattern 6 drawn from the outer land 3. Further, the pattern 4 and the pattern 6 shown in FIG. 3 are narrower than the pattern 4 shown in FIG. 2. As a result, although each pattern 4, 6 is narrow, each pattern 4, 6 cannot be easily cut because a shape of the area 5, 7 is a tear drop.

Namely, in a case where the shape of the area 5, 7 is not improved, because a width of a pattern from a land for an ICT (In-Circuit Tester) is very narrow, each pattern 4, 6 is cut at the area 5,7 by a heat shock or a heat cycle in soldering.

However, in the case that the shape of the area 5, 7 is a tear drop, because each pattern 4, 6 is smoothly connected with each land 1, 3 by gradually widening its width, it is not easily cut.

For example, as a size and a shape of the lands on the printed circuit board 30 shown in FIG. 3, the land-pitch is 0.5 mm, the inner land 1 is a round land with a diameter of 0.4 mm, the outer land 3 is an oval land with a width of 0.15 mm and a length of 0.4~1.0 mm. Further, a width W of each pattern 4, 6 is 50 $\mu$m. In this case, the size D2 of the outer land 3 in the direction along the outside array of the outer lands 3 is 0.15 mm, the size D3 of the outer land 3 in the direction perpendicular to the direction of the outside array of the outer lands 3 is 0.4~1.0 mm, and the size D1 of the inner land 1 in the direction along the inside array of the inner lands 1 is 0.4 mm. The clearance between the pattern 4 and the outer land 3 is 0.15 mm.

Figure 4:
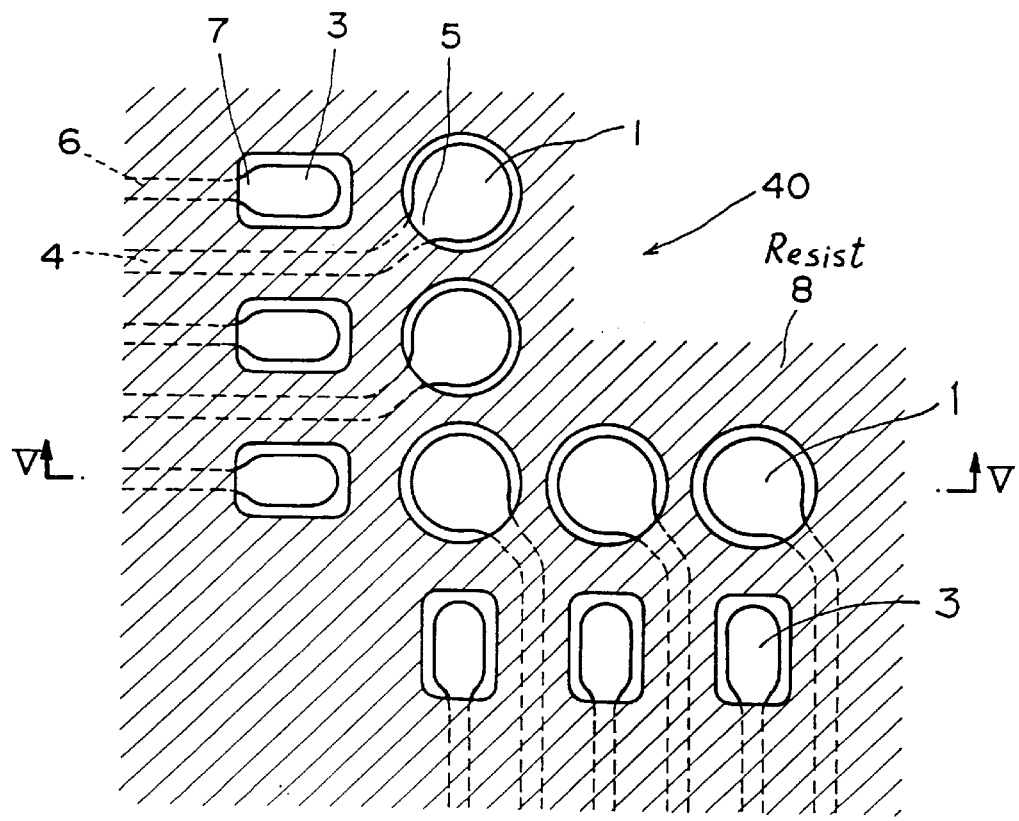
FIG. 4 shows a plan view of another configuration of a printed circuit board as still another embodiment of the present invention.
Figure 5:
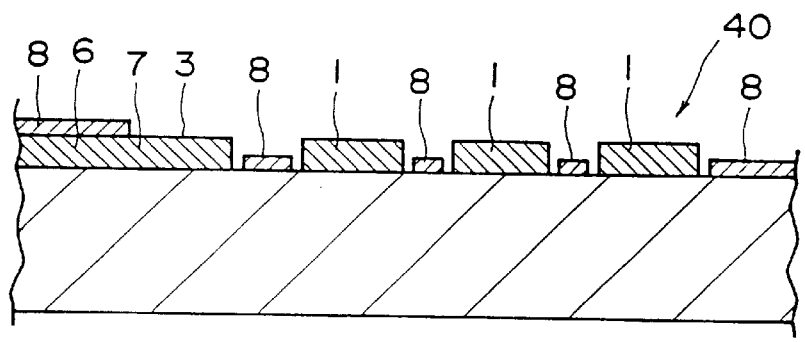
FIG. 5 shows a sectional view along by the arrow marks V—V in FIG. 4.

Next, another configuration of a printed circuit board is shown in FIGS. 4 and 5. Except for coating a resist 8 (a solder resist), the printed circuit board 40 shown in FIGS. 4 and 5 is the same as the printed circuit board 30 shown in FIG. 3. The solder resist 8 is coated on the printed circuit board 40, including the patterns 4 and 6, by an ordinary method for coating the resist 8. Namely, the solder resist 8 is not coated on the lands 1 and 3 at all.

Figure 6:
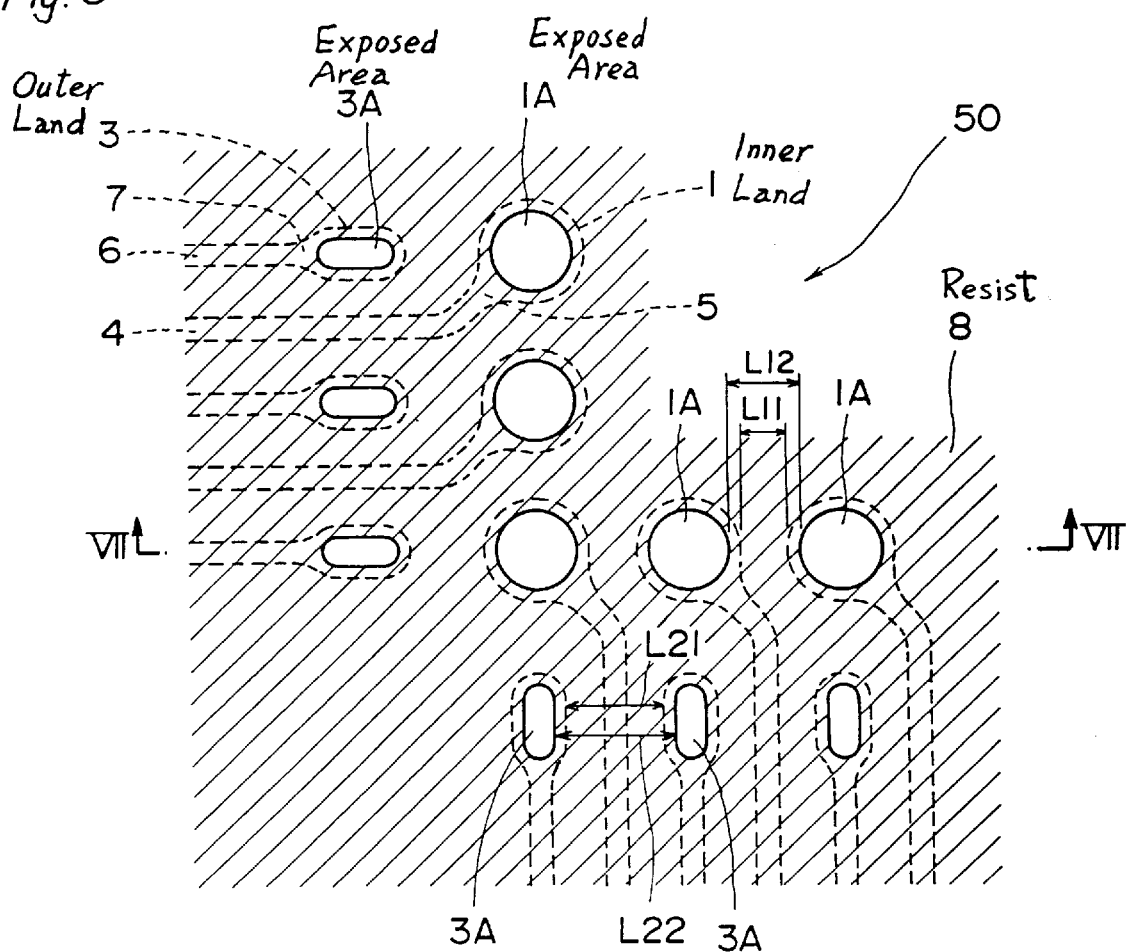
FIG. 6 shows a plan view of another configuration of a printed circuit board as still another embodiment of the present invention.
Figure 7:
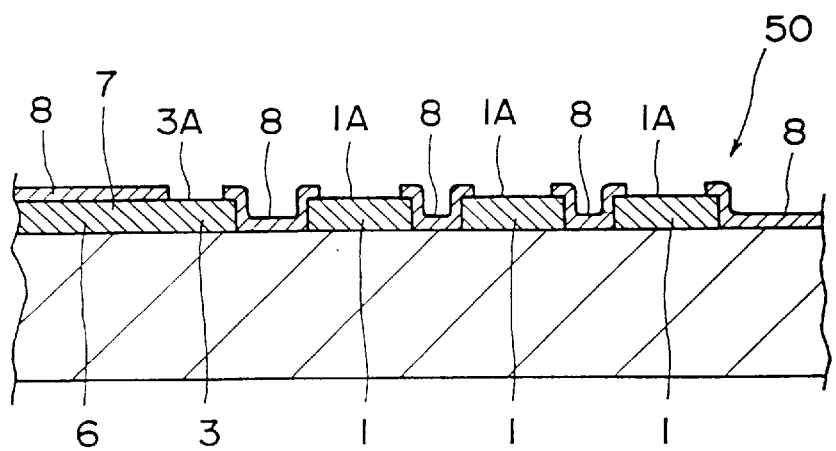
FIG. 7 shows a sectional view along by the arrow marks VII—VII in FIG. 6.
Figure 8:
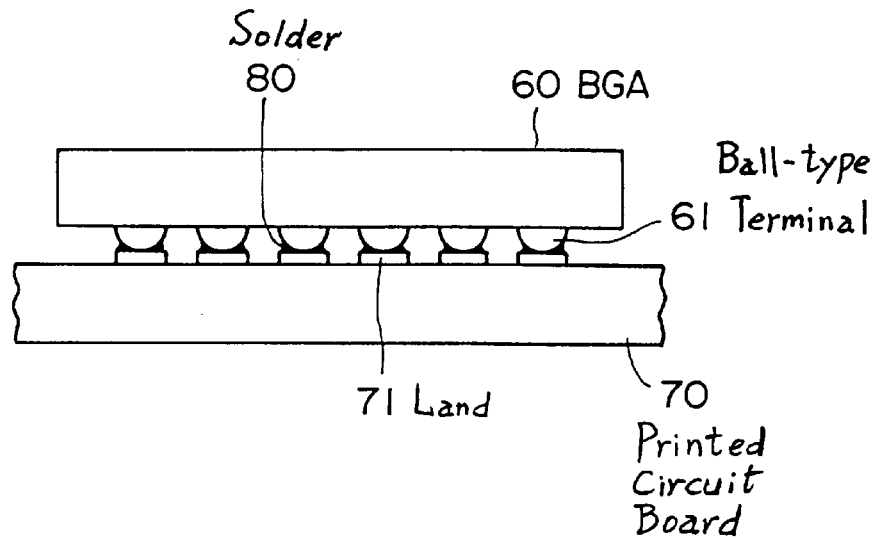
FIG. 8 shows a side view of a printed circuit board on which a BGA is mounted.
Figure 9:
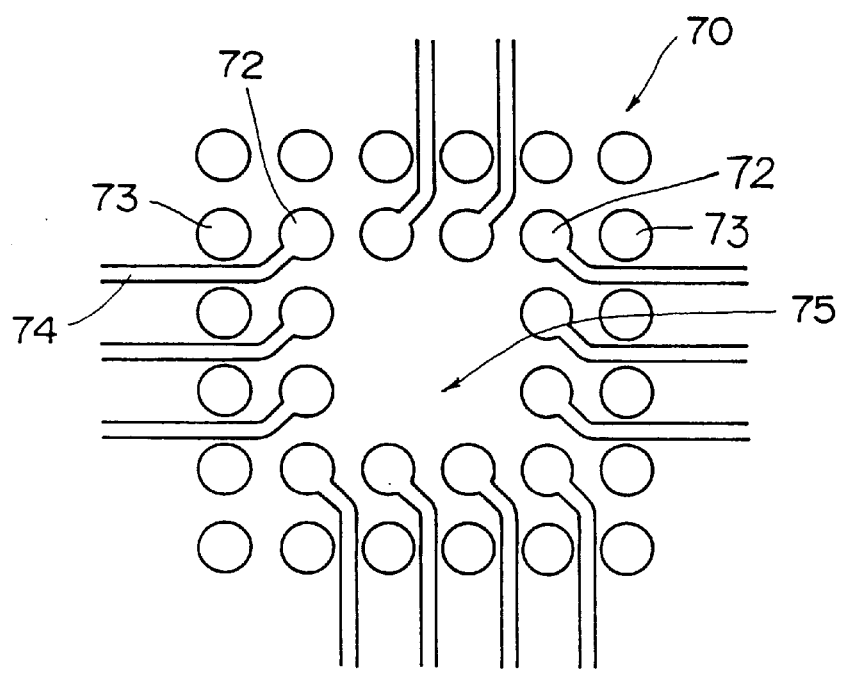
FIG. 9 shows a plan view of a prior art printed circuit board.

Next, another configuration of a printed circuit board is shown in FIGS. 6 and 7. Except for an area where the resist 8 is coated, the printed circuit board 50 shown in FIGS. 6 and 7 is the same as the printed circuit board 40 shown in FIGS. 4 and 5. The solder resist 8 is further coated, around the outer land 3, from an outer area to an inner area of the outer land 3. The resist 8 is further coated, around the inner land 1, from an outer area to an inner area of the inner land 1. Namely, a central area 1A of the inner land 1 and a central area 3A of the outer land 3 are not coated by the resist 8 at all. These areas 1A and 3A are exposed. As a result, the patterns 4 and 6 are not easily cut because the connection areas 5 and 7 are perfectly coated by the resist 8. Further, a clearance L12 between the exposed areas 1A of the inner lands 1 is wider than the clearance L11 between the inner lands 1 themselves because the inner lands 1 are coated by the resist 8, except for their central areas 1A. A clearance L22 between the exposed areas 3A of the outer lands 3 is also wider than the clearance L21 between the outer lands 3 themselves because the outer lands 3 are coated by the resist 8, except for their central areas 3A. Therefore, a bridge of the solder does not easily occur.

According to the present invention, since the size of the outer land in the direction along the outside array of the outer lands is less than the size of the inner land in the direction along the inside array of the inner lands, it is possible to easily pass the pattern from the inner land through the gap between the outer lands. Thus, the printed circuit board, which is suitable for mounting a CSP or the like having a plurality of arrays of the ball-type terminals arranged inside and outside with a very narrow terminal-pitch, can be obtained.

According to the present invention, since the size of the outer land in the direction perpendicular to the direction of the outside array of the outer lands is greater than the size of the outer land in the direction along the outside array of the outer lands, the amount of the solder can be increased. Therefore, the soldered part is not damaged by the thermal cycle and the reliability of the soldered part can be ensured.

According to the present invention, since the size of the outer land in the direction along the outside array of the outer lands is equal to or less than 0.15 mm and each pitch of the inner lands and the outer lands is equal to or less than 0.5 mm, the printed circuit board, which is suitable for mounting a CSP or the like having a plurality of arrays of the ball-type terminals with a very narrow terminal-pitch equal to or smaller than about 0.5 mm, can be obtained.

According to the present invention, since the pattern connected with the inner land is gradually widened for the inner land and the pattern connected with the outer land is gradually widened for the outer land, these patterns can be narrowed. Namely, since each shape of the connected area between the inner land and the pattern drawn from the inner land is a tear-drop shape, and the connected area between the outer land and the pattern drawn from the outer land is also a tear-drop shape, although these patterns are narrow, they cannot be easily cut by a heat shock or a heat cycle in soldering.

According to the present invention, since the solder resist is coated, around the outer land, from the outer area to the inner area of the outer land and also coated, around the inner land, from the outer area to the inner area of the inner land, each connection area between the land and the pattern is reinforced by the resist and the narrow pattern cannot be easily cut. Further, since the clearance between the exposed areas of the lands is widened by coating the resist, the bridge of the solder does not easily occur.

The invention being thus described, it will be apparent that the same may be varied in many ways, such variations are not to be regarded as a departure from the spirit and scope of the invention, and all such modifications as would be obvious to one skilled in the art are intended to be included within the scope of the following claims.

What is claimed is:

1. A printed circuit board, for mounting at least one Chip Size Package with at least one array of at least one ball-type terminal for electric connection arranged inside and outside of one another, comprising:

at least one array of lands for electric connection with said at least one array of ball-type terminal, arranged relatively inside and outside of one another, formed corresponding to said at least one array of ball-type terminal; and a pattern, originating from an inner land and continuing between two outer lands, wherein a size of an outer land, in a direction along an outside array is relatively less than a size of said inner land in a direction along an inside array.

2. The printed circuit board according to claim 1, wherein a width of said pattern originating from said inner land is gradually widened in a connected area between said inner land and said pattern, and a width of a pattern originating from said outer land is gradually widened in a connected area between said outer land and said pattern.

3. The printed circuit board according to claim 2, further comprising:

a resist, coated on the printed circuit board around said outer land, from an outer area to an inner area of said outer land, said resist further being coated around said inner land, from an outer area to an inner area of said inner land.

4. The printed circuit board according to claim 1 wherein the at least one array of at least one ball-type terminal is electrically connected with at least one array of lands.

5. A printed circuit board, for mounting parts with at least one array of at least one ball-type terminal for electric connection arranged relatively inside and outside of one another, comprising:

at least one array of lands for electric connection with said at least one array of ball-type terminal, arranged relatively inside and outside of one another, formed corresponding to said at least one array of ball-type terminal; and a pattern, originating from an inner land and continuing between two outer lands, wherein a size of an outer land, in a direction along an outside array is relatively less than a size of said inner land in a direction along an inside array, and a size of said outer land in a direction perpendicular to said direction along said outside array is relatively greater than the size of said outer land in the direction along the outside array.

6. The printed circuit board according to claim 5, wherein a width of said pattern originating from said inner land is gradually widened in a connected area between said inner land and said pattern, and a width of a pattern originating from said outer land is gradually widened in a connected area between said outer land and said pattern.

7. The printed circuit board according to claim 6, further comprising:

a resist, coated on the printed circuit board around said outer land, from an outer area to an inner area of said outer land, said resist further being coated around said inner land, from an outer area to an inner area of said inner land.

8. A printed circuit board, for mounting parts with at least one array of at least one ball-type terminal for electric connection arranged relatively inside and outside of one another, comprising:

at least one array of lands for electric connection with said at least one array of ball-type terminal, arranged relatively inside and outside of one another, formed corresponding to said at least one array of at least one ball-type terminal; and a pattern, originating from an inner land and continuing between two outer lands, wherein a size of an outer land, in a direction along an outside array is relatively less than a size of said inner land in a direction along an inside array, a size of said outer land, in a direction perpendicular to said direction along said outside array being greater than the size of said outer land in the direction along the outside array, said size of said outer land in the direction along the outside array being equal to or less than 0.15 mm, a pitch between inner lands being equal to or less than 0.5 mm, and a pitch between outer lands being equal to or less than 0.5 mm.

9. The printed circuit board according to claim 8, wherein a width of said pattern originating from said inner land is gradually widened in a connected area between said inner land and said pattern, and a width of a pattern originating from said outer land is gradually widened in a connected area between said outer land and said pattern.

10. The printed circuit board according to claim 9, further comprising:

a resist, coated on the printed circuit board around said outer land, from an outer area to an inner area of said outer land, said resist further being coated around said inner land, from an outer area to an inner area of said inner land.

11. The printed circuit board according to claim 8 wherein the at least one array of at least one ball-type terminal is electrically connected with at least one array of lands.

12. A printed circuit board for mounting at least one Chip Size Package having at least one first inner electric connection land surrounded by at least one first outer electric connection land arranged thereon, comprising:

at least one second inner electric connection land arranged in a first direction, surrounded by at least one second outer electric connection land arranged in the first direction, corresponding to the at least one first inner electric connection land surrounded by the at least one first outer electric connection land arranged on the at least one component, wherein a length of at least one of the at least one second outer electric connection land measured in the first direction is relatively less than a length of at least one of the at least one second inner electric connection land measured in the first direction.

13. The printed circuit board according to claim 12, further comprising:

at least one pattern, originating from at least one second inner electric connection land and continuing between at least one outer electric connection land.

14. The printed circuit board according to claim 12, wherein a length of each outer electric connection land measured in a direction perpendicular to the first direction is relatively greater than the length of the outer electric connection land measured in the first direction.

15. The printed circuit board according to claim 12, wherein the length of the outer electric connection land measured in the first direction is less than or equal to 0.15 mm.

16. The printed circuit board according to claim 12, wherein a pitch between each of the at least one inner electric connection land is less than or equal to 0.5 mm.

17. The printed circuit board according to claim 12, wherein a pitch between each of the at least one outer electric connection land is less than or equal to 0.5 mm.

* * * * *